(12) United States Patent
Damberg

(10) Patent No.: US 7,732,912 B2
(45) Date of Patent: Jun. 8, 2010

(54) SEMICONDUCTOR CHIP PACKAGES AND ASSEMBLIES WITH CHIP CARRIER UNITS

(75) Inventor: Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 782 days.

(21) Appl. No.: 11/502,941

(22) Filed: Aug. 11, 2006

(65) Prior Publication Data
US 2008/0036060 A1 Feb. 14, 2008

(51) Int. Cl.
*H01L 23/04* (2006.01)

(52) U.S. Cl. .................. 257/696; 257/685; 257/686; 257/701; 257/735; 257/737; 257/E23.03; 257/E23.06; 257/E25.006; 257/E25.013; 257/E25.021; 257/E25.027

(58) Field of Classification Search .............. 257/168, 257/276, 625, 452, 675, 706, 707, 712–722, 257/796, E23.075, E31.131, E23.051, E23.08–E23.113, 257/696

See application file for complete search history.

(56) References Cited

U.S. PATENT DOCUMENTS

| 4,151,543 | A | * | 4/1979 | Hayakawa et al. ........... 257/668 |
| 5,334,875 | A | * | 8/1994 | Sugano et al. ............... 257/686 |
| 5,397,916 | A | * | 3/1995 | Normington ................ 257/686 |
| 6,239,496 | B1 | * | 5/2001 | Asada ......................... 257/777 |
| 6,593,648 | B2 | * | 7/2003 | Emoto ......................... 257/696 |
| 6,679,977 | B2 | | 1/2004 | Haag et al. |
| 6,897,565 | B2 | | 5/2005 | Pflughaupt et al. |
| 7,338,837 | B2 | * | 3/2008 | Howard et al. ............. 438/109 |
| 2005/0173805 | A1 | | 8/2005 | Damberg et al. |
| 2005/0181544 | A1 | | 8/2005 | Haba et al. |
| 2005/0181655 | A1 | | 8/2005 | Haba et al. |

* cited by examiner

*Primary Examiner*—Jasmine J Clark
(74) *Attorney, Agent, or Firm*—Lerner, David, Littenberg, Krumholz & Mentlik, LLP

(57) ABSTRACT

A microelectronic element package has one or more individual carrier units overlying a region or regions of the front or rear surface of the microelectronic element, leaving other regions of the microelectronic element surface uncovered. The carrier units can be made economically using only a small area of a dielectric film or other circuit panel material.

40 Claims, 11 Drawing Sheets

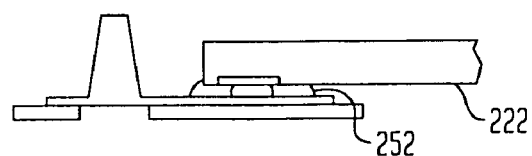
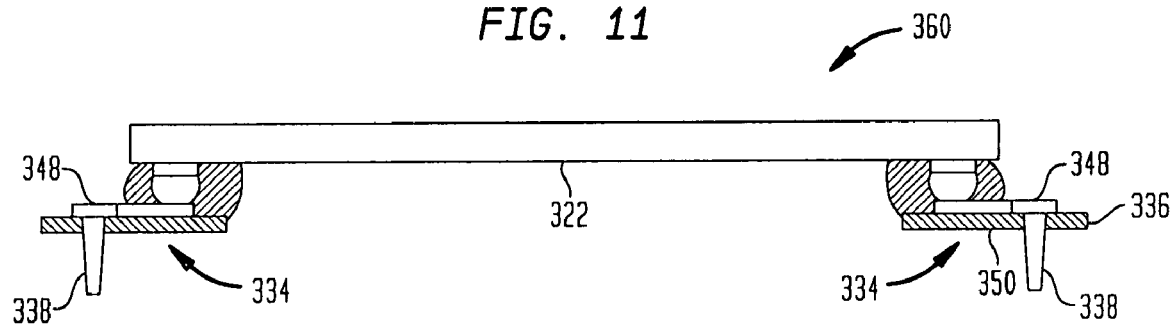
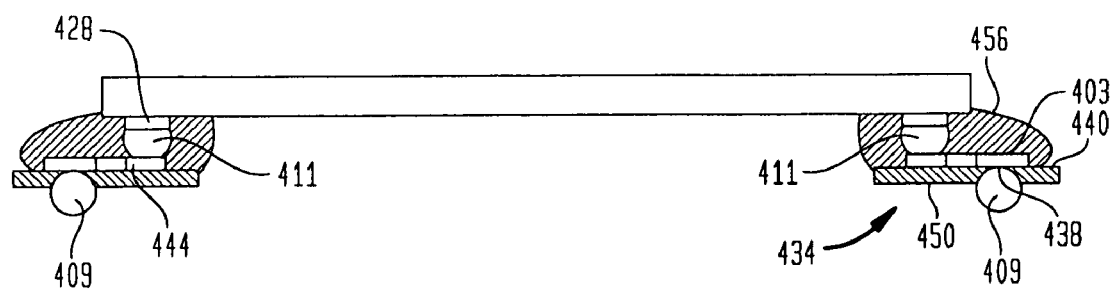

SEMICONDUCTOR CHIP PACKAGES AND ASSEMBLIES WITH CHIP CARRIER UNITS

BACKGROUND OF THE INVENTION

Semiconductor chips normally are formed as small, flat bodies having a generally planar front surface, a generally planar rear surface, and edges extending between these surfaces at the boundaries of the front and rear surfaces. The thickness of the chip between its front and rear surfaces generally is far smaller than the length and width of the chip, i.e., the dimensions of the front and rear surfaces in the planes of these surfaces. Typically, the chip has contacts exposed at its front surface.

Semiconductor chips commonly are provided in packages which protect the chip and facilitate handling and mounting of the chip to a larger circuit element such as a circuit board or other circuit panel. Certain types of chip packages include a rigid or flexible dielectric structure sometimes referred to as a "chip carrier" overlying the front or rear surface of the chip. The chip carrier has electrically conductive terminals. The contacts of the chip are electrically connected to the terminals. The terminals may be elongated posts projecting from the chip carrier, most commonly from the surface of the chip carrier facing away from the chip. Packages of this type are disclosed in U.S. Published Patent Applications 2005/0181544 A1, 2005/0181655 A1, and 2005/0173805, the disclosures of which are incorporated by reference herein. In other packages, the terminals are in the form of flat pads. For example, certain embodiments shown in U.S. Pat. No. 6,679,977, the disclosure of which is also incorporated by reference herein, include terminals of this type.

A packaged chip can be mounted to a circuit panel by bonding or otherwise connecting the terminals to the contact pads of the circuit panel. In some cases, the chip carrier is approximately the same size as the front or rear surface of the chip itself, and most or all of the terminals are disposed in a region of the circuit panel overlying the chip surface. In other cases, the chip carrier is larger than the chip so that the chip carrier projects outwardly beyond the edges of the chip. The terminals on the chip carrier may be larger than the contacts on the chip itself, and may be spaced at a larger spacing distance or "pitch" than the contacts of the chip. Moreover, the terminals may be arranged so that they can be more readily engaged by test equipment than the contacts of the chip itself. Also, the chip carrier provides mechanical protection for the chip during handling and mounting operations.

Certain chip packages are made with chip carriers having terminals in a region of the chip carrier projecting beyond the edges of the chip. Some of the terminals are exposed at the surface of the chip carrier facing away from the chip, and others are exposed at the opposite surface. Packages of this type can be used, for example, in a stacked module. In a stacked module, the packages are disposed one atop the other, so that the front surface of the chip in one package faces generally toward the rear surface of the chip in another package. The chip carriers extend between the adjacent chips in the stack of packages. The terminals on the various chip carriers are aligned with one another and joined to one another. Stacked arrangements of this type provide a compact mounting for multiple chips as, for example, semiconductor memory chips.

Despite considerable effort in the art devoted to development of chip packages heretofore, still further improvement would be desirable. In particular, it would be desirable to reduce the cost of the packaged chips.

SUMMARY OF THE INVENTION

One aspect of the invention provides packaged microelectronic elements. The packaged microelectronic element according to this aspect of the invention desirably includes a microelectronic element such as a semiconductor chip having front and rear surfaces, edges bounding these surfaces and contacts exposed at said front surface adjacent at least two of said edges. The packaged element further includes one or more carrier units. Each carrier unit desirably includes a dielectric layer and electrically conductive features including terminals for connection to an external circuit panel. The carrier units overlie a region or regions of the front or rear surface of the microelectronic element, but desirably do not cover other regions of such surface. For example, two or more carrier units may overlie edge regions of the microelectronic element surface adjacent at least two of the edges, and the carrier units may be spaced apart from one another, so that a central region of the front or rear surface is not covered by the carrier units. At least some of the conductive features of the carrier units are connected to at least some of the contacts of the microelectronic element.

The carrier units may project laterally outwardly beyond the edges of the microelectronic element, and at least some of the terminals may be disposed on the projecting portions, laterally outward of said microelectronic element. The terminals may include terminals exposed at either or both surfaces of the dielectric layers of the chip carriers. Some or all of the terminals may be in the form of posts projecting from the dielectric layer.

A further aspect of the invention includes a module. The module according to this aspect of the invention desirably includes a plurality of packaged microelectronic elements as discussed above. The packaged elements may be stacked in superposed relation to one another with the front surface of the microelectronic element in one packaged element facing toward the rear surface of the microelectronic element in another one of said packaged element.

Another aspect of the invention provides a method of making a packaged microelectronic element. The method according to this aspect of the invention desirably includes the step of uniting a plurality of carrier units with a microelectronic element so that the carrier units overlie edge regions of a front or rear surface of the microelectronic element adjacent at least two edges of the microelectronic element and so that said carrier units are spaced apart from one another leaving a portion of the surface of the microelectronic element uncovered by said carrier units. The method desirably also includes electrically connecting contacts of the microelectronic element exposed at the front surface of the microelectronic element to terminals of the carrier units. The uniting step may include providing one or more arrays each including numerous carrier units and separating the plurality of carrier units from the one or more arrays.

BRIEF DESCRIPTION OF THE DRAWINGS

FIG. 10 is a fragmentary, diagrammatic sectional view depicting a portion of the package made using the components of FIG. 9.

FIG. 11 is a diagrammatic sectional view depicting a package according to yet another embodiment of the invention.

FIG. 12 is a diagrammatic sectional view depicting a package according to a still further embodiment of the invention.

DETAILED DESCRIPTION

Figure 1:
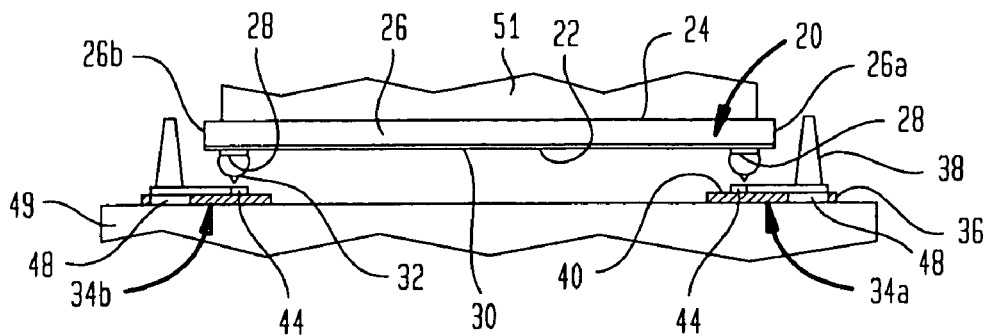
FIG. 1 is a diagrammatic sectional view depicting components used in a method according to one embodiment of the invention.

A manufacturing process in accordance with one embodiment of the invention utilizes a semiconductor chip 20 having a generally rectangular front surface 22 and a rear surface 24 with edges 26 extending between these surfaces. The chip has contacts 28 exposed at the front surface 22. The contacts 28 are disposed adjacent two opposite edges 26a and 26b of the chip, in rows extending into and out of the plane of the drawings as seen in FIG. 1. Contacts 28 are depicted as projecting from the front surface 22 solely for clarity of illustration. In this disclosure, a conductive feature such as a contact or terminal may be referred to as "exposed at" a surface of a semiconducting or dielectric body, so long as the conductive feature is accessible by a theoretical point moving towards the body in a direction normal to the surface. Such a feature may project from the surface, may be flush with the surface, or may be recessed relative to the surface. The front surface of the chip may be constituted by a passivation layer 30, such as a layer of a polymeric material as, for example, a "spun-on" polyimide coating, or a layer of a dielectric such as silicon dioxide or silicon nitride. The passivation layer has gaps at the contacts.

In the particular embodiment illustrated in FIG. 1, the contacts 28 are provided with stud bumps 32. Each stud bump may be formed by applying a ball of a conductive material such as gold or aluminum formed at the end of a fine wire to a particular contact and then severing the wire, leaving the stud bump 32. The process of stud bumping per se is well-known in the art, and therefore, is not further discussed herein.

The manufacturing process also utilizes carrier units 34. Each carrier unit 34 includes a dielectric element 36 and terminals 38 exposed at a first surface 40 of the dielectric element 36. In the particular embodiments shown in FIGS. 2 and 3, terminals 38 are in the form of posts projecting away from the first surface 40. Each carrier unit further includes conductors 42 connected to terminals 38. Each conductor has a contact end 44 remote from terminal 38. In the particular embodiment depicted, the contact end 44 of each conductor is also exposed at the first surface 40 of the carrier unit, so as to form a bond pad exposed at this surface. In this particular embodiment as well, the dielectric element 36 has an opening 46 in alignment with each terminal 38, so that a portion of the conductor 42 aligned with the terminal 38 is exposed through such opening so as to provide a further terminal 48 exposed at the second surface 50 of the dielectric element, terminals 48 being electrically connected to terminals 38 and aligned with terminals 38. The dielectric element 36 may be formed from a dielectric material such as those commonly used for chip carriers as, for example, unreinforced and reinforced polymers, ceramics or glass. The conductive features such as the terminals and conductors may be formed from metals as, for example, copper and gold, and electrically conductive polymers.

Figure 2:
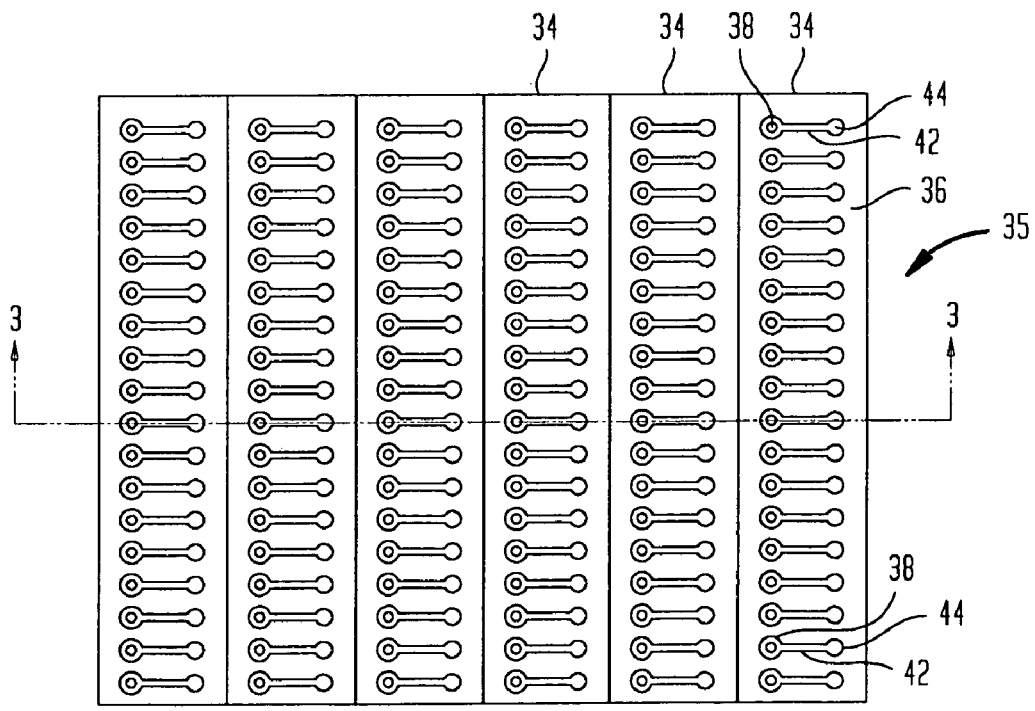
FIG. 2 is a diagrammatic plan view depicting components used in the method of FIG. 1.
Figure 3:
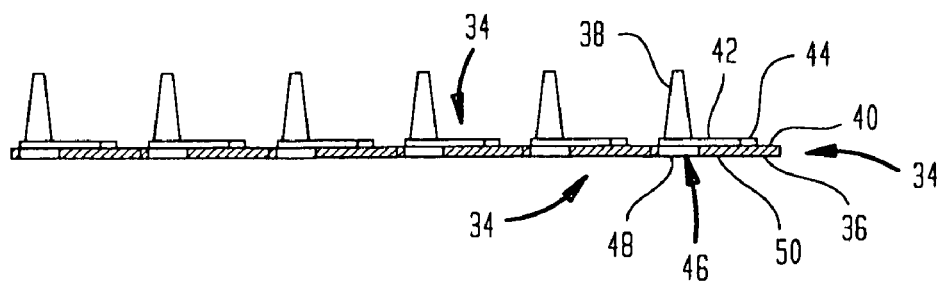
FIG. 3 is a diagrammatic sectional view taking along line 3-3 in FIG. 1.

In the particular arrangement depicted in FIGS. 2 and 3, each terminal 38 and the corresponding terminal 48 on the opposite surface are connected to only one lead, and conversely, each contact end or bond pad 44 is connected to only one set of terminals 38 and 48. This simple arrangement is shown for purposes of illustration only; the interconnections between the contact ends or bond pads and the terminals may include any desired pattern of interconnections. For example, some of the terminals and some of the bond pads or contacts ends may be left unconnected. Conversely, some of the contact ends or bond pads may be connected to multiple terminals 38, 48. As disclosed, for example, in U.S. Pat. No. 6,897,565, the disclosure of which is also incorporated by reference herein, terminals on a chip carrier may have multiple connections which can be selectively disconnected or, conversely, selectively connected, and the same arrangement can be employed in the carrier units.

Figure 6:
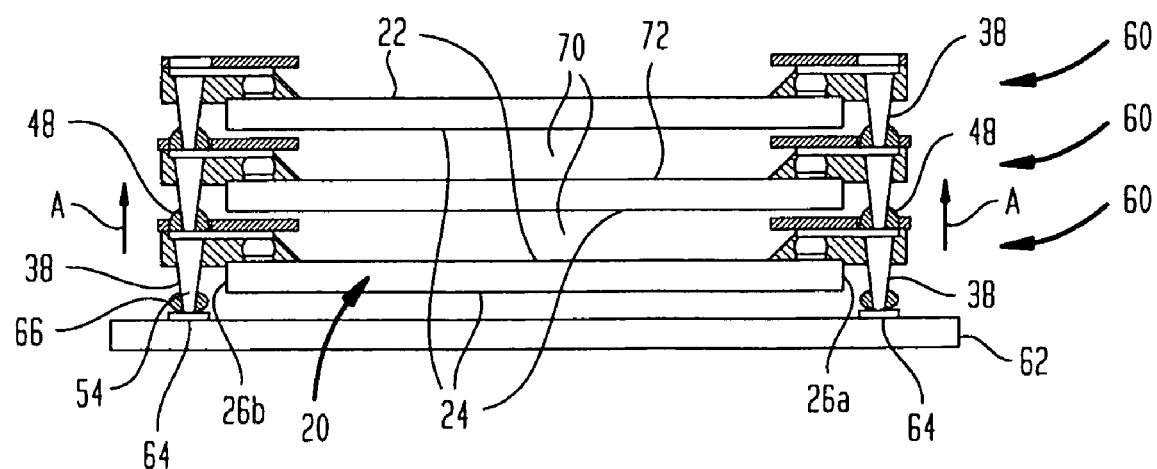
FIG. 6 is a diagrammatic sectional view depicting a module in accordance with a further embodiment of the invention.

As best seen in FIG. 2, the dielectric element 36 of each carrier unit is elongated and strip-like. The width of each strip is just slightly larger than the maximum distance in the width-wise direction between the contact ends 44 of the conductors and the terminals 38. Carrier units 34 may be provided as parts of one or more larger arrays such as sheets or tapes 35, one of which is shown in FIG. 6, with a unitary dielectric element forming the dielectric elements 36 of all of the carrier units. The boundaries between adjacent carrier units are shown in solid lines in FIG. 2 for clarity of illustration. However, in practice, these boundaries may be invisible while the carrier units are united in the sheet or tape.

In the assembly process, each chip 20 is united with two carrier units 34a and 34b. (FIG. 1.) The two chip carrier units are severed from the tape 35 prior to this step. Carrier unit 34a is disposed so that the dielectric element 36 of this carrier unit overlies an edge region of the chip front surface 22 adjacent edge 26a, and projects outwardly in a horizontal direction parallel to the plane of the front surface beyond edge 26a. The first surface 40 of the carrier unit faces rearwardly, toward the chip front surface 22. The contact ends or bond pads 44 of this carrier unit are aligned with the contacts 28 of the chip adjacent edge 26a. Carrier unit 34b is positioned in a similar manner, except that the dielectric element of this carrier unit overlies an edge region of the chip adjacent the opposite edge 26b of the chip, and the contact ends 44 of this carrier unit are aligned with the terminals 28 adjacent edge 26b.

The chip is mechanically and electrically connected to the carrier units by bonding terminals 28 and stud bumps 32 thereon to the contact ends or bond pads 44 of the leads on the carrier units. As schematically depicted in FIG. 1, the carrier units 34a and 34b may be held on a fixture 49, whereas the chip may be engaged with another fixture 51, and these fixtures may be forced together with one another with application of heat and vibrations such as sonic or ultrasonic vibrations to form a bond between the stud bumps and the contact ends of the leads. Alternatively, the contact ends of the leads may be individually bonded to the stud bumps using a small sonic or ultrasonic bonding tool (not shown).

After formation of these bonds, the bonds and the edge regions of the chip front surface 22 are covered by an encapsulant 52 (FIG. 4) which may also cover the proximal ends of terminals or posts 38 adjacent the dielectric layers 36 of the carrier units, but which leaves the tips 54 of the posts, remote from the dielectric layers, uncovered. Encapsulant 52 desirably extends between the chip front surface and the dielectric layer of each carrier unit, but desirably does not extend over the entirety of the chip front surface.

Figure 4:
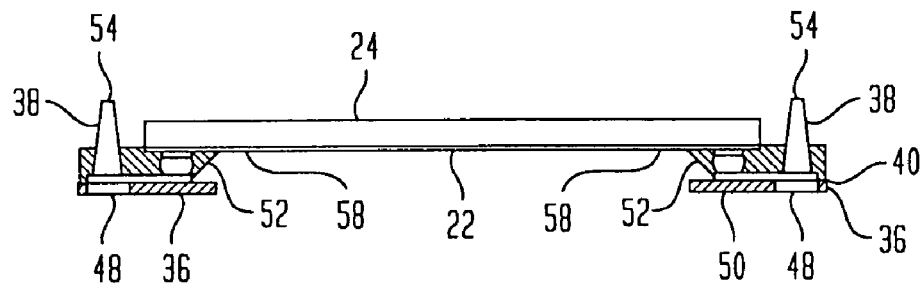
FIG. 4 is a sectional view similar to FIG. 1 depicting a package according to one embodiment of the invention formed in the process of FIG. 1.

As shown in FIG. 4, the resulting packaged chip has carrier units 34a and 34b overlying edge regions 56a and 56b of the chip front surface 22 (the surface facing away from the viewer in FIG. 5) and projecting outwardly beyond the edges 26a and 26b of the chip. The first surface 40 of each carrier unit dielectric 36 faces rearwardly toward the chip front surface 22, whereas the second surface 50 faces forwardly, away from the chip. The posts 38 constitute rear-facing terminals which project rearwardly from the chip carrier dielectric and project beyond the rear surface 24 of the chip. Terminals 48 face forwardly, away from the chip.

Figure 5:
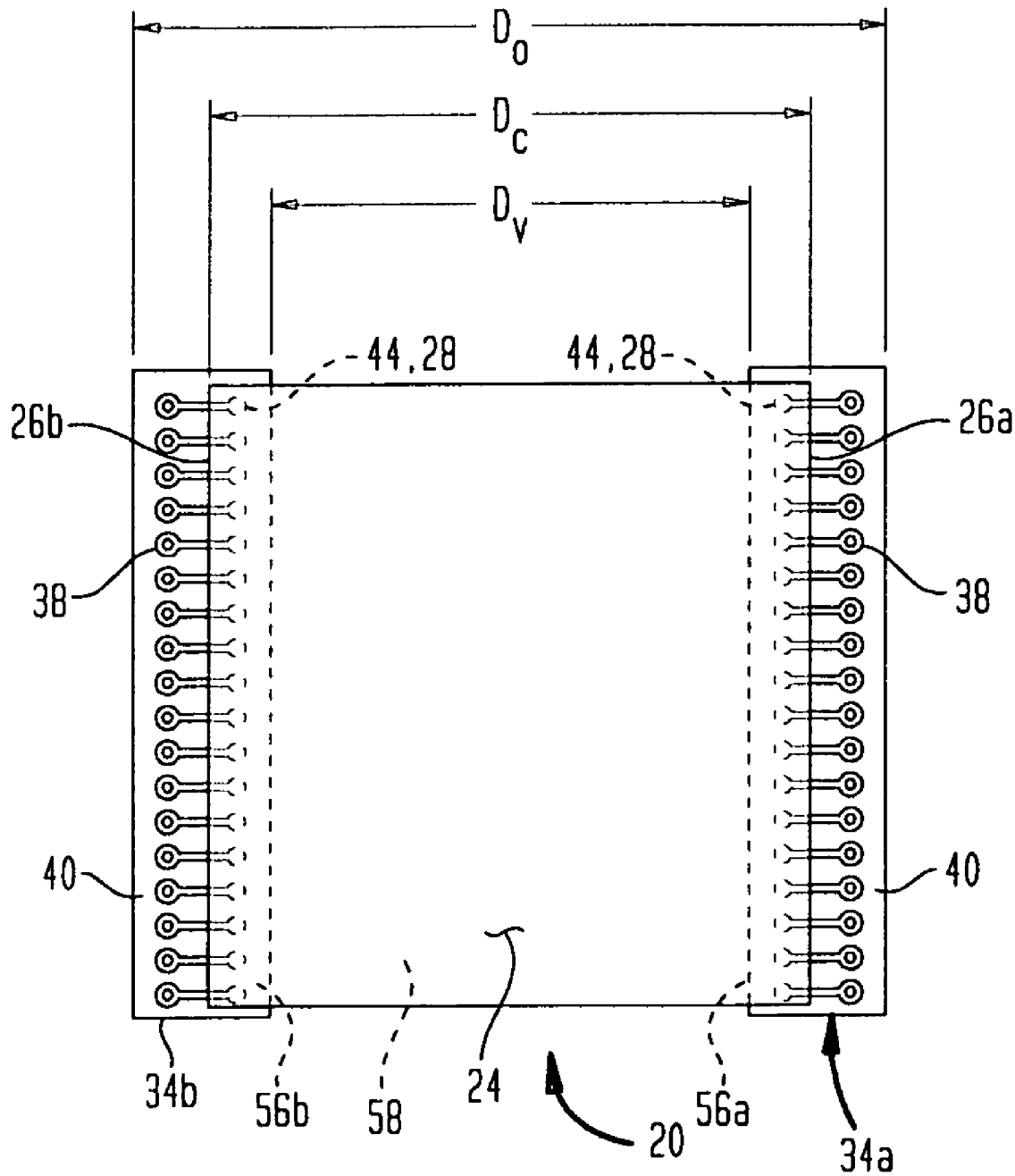
FIG. 5 is a top plan view of the package shown in FIG. 4.

As best appreciated with reference to FIG. 5, the carrier units cover only relatively small portions of the chip front surface. A central region 58 of the chip front surface (FIGS. 4 and 5) is not covered by either carrier unit. Those portions of the carrier units 34a and 34b which overlie the chip front surface desirably cover less than about 50% of the entire chip front surface 22, and more desirably less than about 20% of such surface. Stated another way, the spacing distance $D_U$ between the closest portions of the carrier units 34a and 34b—which is identical to the lateral dimension of the uncovered, central region 58 of the chip front surface—is a substantial proportion of the lateral dimension $D_C$ between the edges 26a and 26b of the chip, and is also a substantial proportion of the overall width $D_O$ of the chip package including the carrier units and chip. For example, $D_U$ may be about 50% or more, and desirably about 80% or more of $D_C$, and may be about 50% or more of $D_O$. The aggregate area of the carrier units (including both the regions overlapping the chip and the regions projecting from the chip) also may be substantially less than the area of the chip front surface. Thus, the sum of the areas of carrier units 34a and 34b may be less than 50% of the area of the chip front surface, and desirably considerably less as, for example, about 25% of such area or less.

Structures according to this embodiment can be fabricated economically. In particular, the cost of structures such as carrier units 34a and 34b, which include metallic features on a dielectric layer, typically is directly related to the area of such structure in the plane of the dielectric layer. The package and the manufacturing method thus achieve significant cost saving by eliminating unnecessary portions of the dielectric layer. These advantages are particularly significant in the case of relatively large chips having contacts only in the edge regions of the chip adjacent the edges of the chip. Certain memory chips such as SRAM chips are formed with contacts in this configuration. Moreover, by leaving both the front and rear surfaces of the chip substantially uncovered, the package provides efficient convective heat transfer from these surfaces during operation of the chip. These benefits are provided while still maintaining acceptable levels of mechanical protection for the chip. Because the carrier units and encapsulant overly the front surface at its edges, the package effectively protects the most sensitive areas of the chip front surface during handling. The package can be handled by engaging the carrier units with a handling device or storage container, and without engaging the chip front surface itself. Typically, the passivation layer incorporated in the chip provides adequate protection against chemical contamination of the chip, which might affect the internal electric circuitry of the chip.

A package according to this embodiment of the invention can be mounted by placing the package 60a (FIG. 6) on a circuit panel 62, with the chip rear surface facing downwardly toward the circuit panel, and bonding the ends 54 of the terminals or posts 38 to contact pads 64 on the circuit panel 62 using solder 66 of other bonding material.

Prior to placement on the circuit panel, the package may be tested by engaging tips 54 with a test fixture (not shown). As discussed in the aforementioned 2005/0181544 A1, 2005/0181655 A1, and 2005/0173805 publications, it is desirable to provide the posts with the ability to move and tilt to promote engagement with the conductive elements of a test fixture. Movement and tilting of the posts allows for engagement with the text fixture even where the tips, prior to engagement, are not precisely coplanar with one another.

To facilitate such movement and tilting, the carrier units may be provided with features as taught in the aforementioned publications. Moreover, in the embodiment of FIGS. 5 and 6, those portions of the carrier units projecting beyond the edges of the chip and the encapsulant disposed on such portions form a composite structure which is supported as a short, wide cantilever beam projecting laterally from the chip. The projecting portions of the structure can bend to some degree about axes parallel to edges 26a and 26b (axes into and out of the plane of the drawing in FIG. 6), in the directions indicated by arrow A, when the post tips are engaged with a test fixture. The degree of bending and the degree of post tilting caused by such bending can be controlled by controlling the physical properties of the encapsulant dielectric layer and metallic conductive features of the carrier units. The same features which facilitate movement and tilting of the posts also allow movement of the post tips during service. Such movement compensates for differential expansion and contraction of circuit panel 62 and chip 20.

Packages of this type can be stacked as also shown in FIG. 6. In such a stack, the packages 60 are superposed on one another, with the rear surface 22 of the chip in each package facing toward the front surface 24 of the chip in a neighboring package. The rear-facing terminals or posts 38 of each package in the stack (other than the lowest package 60*a*) are engaged with the forward-facing terminals 48 of the next lower package in the stack. The tips of the posts or rearward-facing terminals 38 are bonded to the forward-facing terminals 48 by an appropriate solder or other bonding material. The connected terminals form vertically-extensive electrical conductors. The stack may be assembled prior to mounting the stack on the circuit panel 62, or after mounting the lowest package 60*a* in the stack to the circuit panel. Although a stack of three chips is depicted in FIG. 6, any number of packages may be included in such a stacked unit. The stacked arrangement provides particularly effective cooling for the chips within the stack. The separate carrier units incorporated in each package do not obstruct air flow to the central regions of the chips, remote from the carrier units. Also, an appreciable portion of the height or vertical extent of the stack is taken up by open air spaces or gaps 70 between adjacent chips. These unobstructed gaps provide good air flow, which further promotes efficient convective cooling.

In the embodiments depicted in FIGS. 1-6, the carrier units 34*a* and 34*b* used in each package are depicted as having the same configuration of leads and terminals. However, the two carrier units may have different configurations as, for example, different numbers of terminals 38 and different numbers of bond pads 44, and different patterns of interconnections between the terminals and the bonding pads. Additionally, although the carrier units are depicted as having the leads 42 disposed on the first surface of the chip carrier, this is not essential; in other arrangements, the leads and other metallic features may be disposed on the opposite surface or disposed within the thickness of the dielectric layer, and may be exposed as necessary through openings in the dielectric layer. Also, carrier units may include more than one layer of metallic features. The arrangement of the contact ends or bond pads 44 is selected to match the arrangement of the chip contacts adjacent one edge of the chip. In the particular arrangement shown, the contact ends are arranged in a single straight row at a uniform spacing, but this is not essential. The chip may include multiple rows of contacts in each edge region, or an irregular arrangement of contacts in each edge region. Similarly, the arrangements of terminals 38 and 48 are selected to match the desired pattern of interconnections with a circuit panel or with another package. Where multiple packages are arranged in a stack, the packages may be the same or different, and may include the same chip or different chips. Where different carrier units are used with a single chip, the carrier units initially may be provided as different portions of the same sheet or tape, or in two different sheets or tapes.

Figure 7:
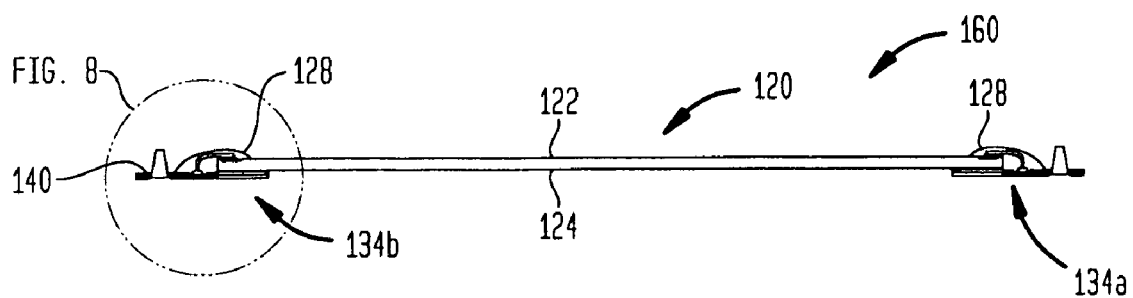
FIG. 7 is a diagrammatic sectional view depicting a package in accordance with a further embodiment of the invention.
Figure 8:
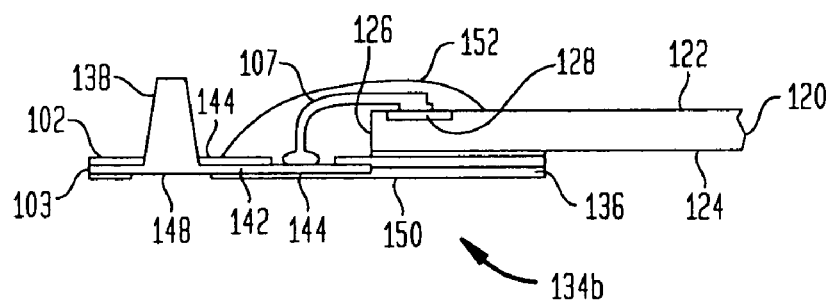
FIG. 8 is a diagrammatic sectional view on an enlarged scale depicting a portion of the package shown in FIG. 7.

A package 160 in accordance with a further embodiment of the invention (FIGS. 7 and 8) includes two carrier units 134*a* and 134*b*, together with a chip 120, which has contacts adjacent edges of its front surface 122. In this embodiment, however, the carrier units overlie edge regions of the chip rear surface 124. As best seen in FIG. 8, each carrier unit includes a dielectric layer 136, a solder mask layer 102 which defines a first or front surface 144, and a metallization layer 103 disposed between the solder mask layer and the dielectric layer. The metallization layer defines leads 142 having contact ends or bond pads 144. The contact ends or bond pads are exposed through openings in the solder mask layer to the surface 144 defined by the solder mask layer. Terminals 138 project from this front first surface 144. Additional terminals 148 are exposed through openings in the dielectric layer 136 so that these additional terminals face in the direction of the second surface 150 of the carrier unit, defined by the dielectric layer 136. The carrier units are mounted with the first surface 144 overlying edge regions of the rear surface 124 of the chip, adjacent an edge 126. Thus, first surface 144 and posts or terminals 138 face forwardly toward the rear surface of the chip; whereas second surface 150 and terminals 148 face rearwardly, away from the chip. The forward-facing terminals 138 project forwardly, beyond the front surface 122 of the chip; whereas the rearward-facing terminals 148 face away from the chip. The bond pads or contact ends of the leads are electrically connected to contacts 128 of the chip by wire bonds 107 extending between the contact ends of the leads and the contacts. The wire bonds extend outwardly and rearwardly from the bond pads, beyond the edges of the chip to the contact ends of the leads. Although only one row of contacts 128 is depicted adjacent an edge in FIG. 8, other contacts (not shown) may be provided on other regions of the front surface inboard of the contacts depicted in the drawing, and some of the wire bonds may extend to these other contacts as well. An encapsulant 152 overlies the edges of the chip having the wire bonds and the adjacent edge regions of the chip front surface 122, as well as the wire bonds 107. Packages of this type can be made using methods similar to those discussed above, and can be used individually or in stacked assemblies as discussed above.

Figure 9:
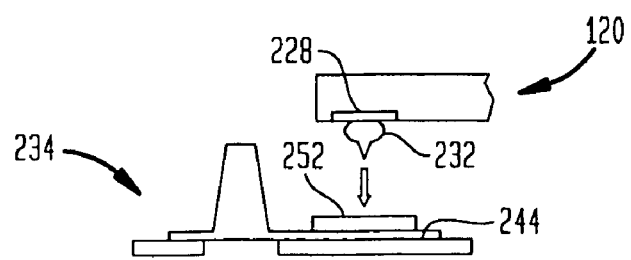
FIG. 9 is a fragmentary, diagrammatic sectional view depicting portions of components used in a method according to a further embodiment of the invention.

A package and assembly process according to a further embodiment of the invention (FIGS. 9 and 10) utilizes carrier units 234 essentially identical to those discussed above with reference to FIGS. 1-6. In this process, however, an encapsulant of that commonly referred to as a "no-flow" encapsulant 252 is disposed over the contact ends or bond pads 244 of the carrier units before the carrier units are assembled with the chip. The stud bumps 232 on the chip contacts 228 penetrate through the encapsulant during the bonding process and make electrical contact with the lead contact ends 244. The encapsulant 252 is compressed slightly between the chip front surface 222 and the adjacent surface of the carrier unit as shown in FIG. 10.

A chip package 360 (FIG. 11) according to yet another embodiment of the invention includes carrier units 334 having post-like terminals 338 which extend through the dielectric layer 336 so that the posts are exposed at the second surface 350 of each carrier unit, i.e., the surface facing away from the chip in the finished assembly. Here again, the structure also defines terminals 348 facing in the opposite direction from the post-like terminals. These carrier units are mounted on edge regions of the chip front surface 322. Thus, the post-like terminals 338 project forwardly, away from the front surface of the chip, whereas terminals 348 are exposed to the rear of the package.

A package according to a still further embodiment (FIG. 12) includes carrier units 434 having a flat metallization layer 403 which defines terminals 438 in the form of flat pads exposed through holes in the dielectric layer to the second surface 450. Terminals 438 may be connected to a circuit panel, or to another chip package by solder balls 409 or other masses of electrically conductive bonding material. Also, in this embodiment, the contact ends 444 of the leads are connected to the contacts 428 of the chip by other solder masses 411. This embodiment has only terminals 438 facing in a forward direction, away from the chip. The outboard ends of the leads aligned with are covered by encapsulant 452, and hence do not serve as terminals on the first surface 440 of the chip carrier. In a further variant, the encapsulant may be limited so that it does not cover these outboard ends of the leads, and hence, the outboard ends of the leads provide additional terminals exposed on surface 440 and facing rearwardly toward the chip.

The foregoing embodiments are merely illustrative of the numerous terminal configurations and numerous ways in which the connection can be made between the contact ends of the leads and the contacts of the chip. The terminals can include essentially any structure capable of serving as a terminal on a chip carrier. Also, the connections between the contact ends of the leads and the contacts of the chip can be made in any suitable manner. Merely by way of example, the contact ends can be connected to the contacts of the chip by structures such an anisotropic adhesive, eutectic bonding of the leads directly to the contacts, or thermalsonic bonding of the leads to the contacts. The terminals may be exposed at either surface of the chip carrier or at both surfaces.

Figure 13:
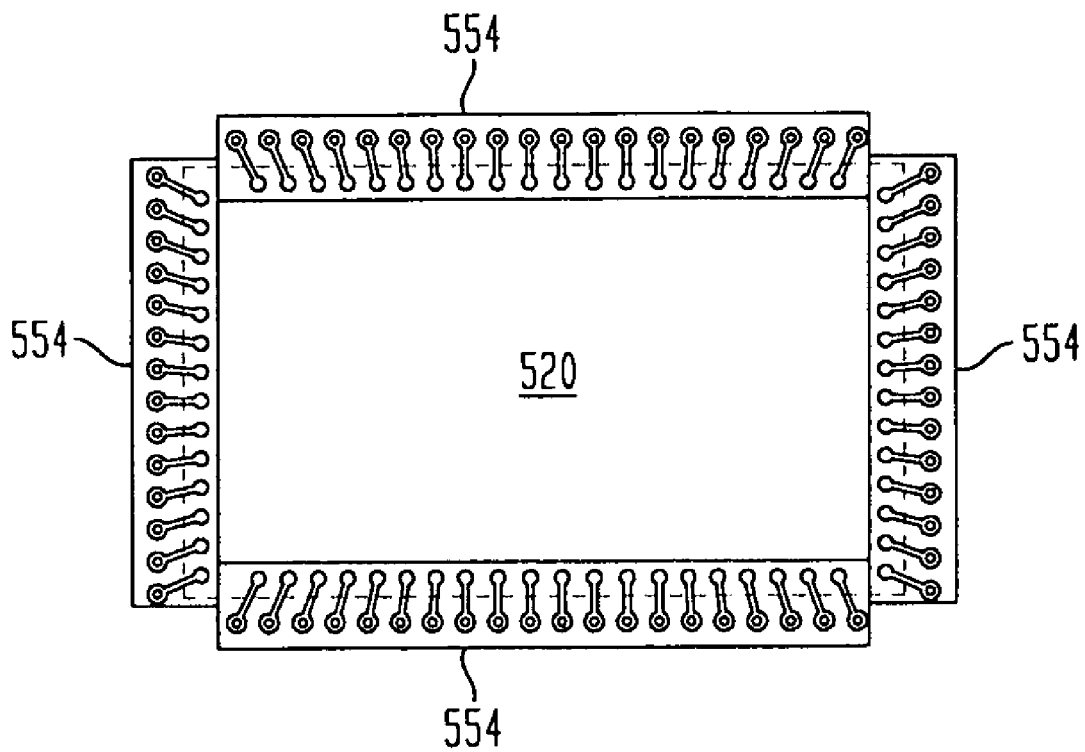
FIG. 13 is a top plan view depicting a package according to yet another embodiment of the invention.

As shown in FIG. 13, carrier units 554 may be mounted at four edges of the chip 520, rather than at only two opposite edges. In a further variant (not shown), carrier units are provided at two opposite edges and at one additional edge extending between these opposite edges. Stated another way, carrier unit 554a along one edge is omitted. In still other variants, the chip may be a hexagonal structure having six edges, in which case carrier units may be mounted along any number of these edges.

Figure 14:
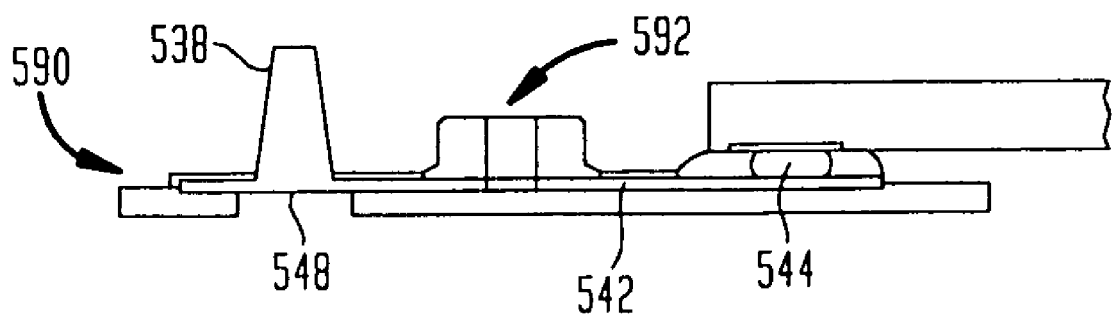
FIG. 14 is a fragmentary, diagrammatic sectional view depicting portions of a package according to a still further embodiment of the invention.

As shown in FIG. 14, a carrier unit 590 according to yet another embodiment of the invention incorporates passive components such as a capacitor 592 connected between the contact end 544 and terminals 538, 548 of a lead 542. Other passive components, such as inductors and resistors, may be connected to the carrier units or built into the structure of such units. Active semiconductor components such as diodes for electrostatic discharge protection also may be mounted to the carrier units.

Figure 15:
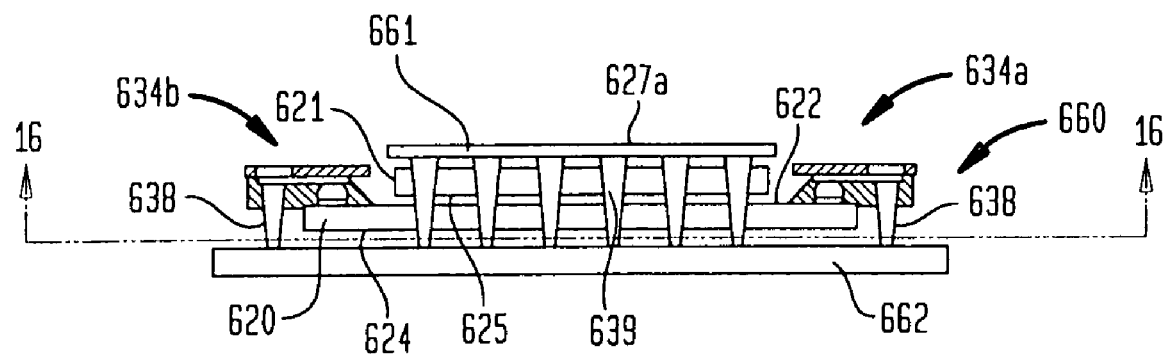
FIG. 15 is a diagrammatic elevational view depicting a portion of a module according to a still further embodiment of the invention.
Figure 16:
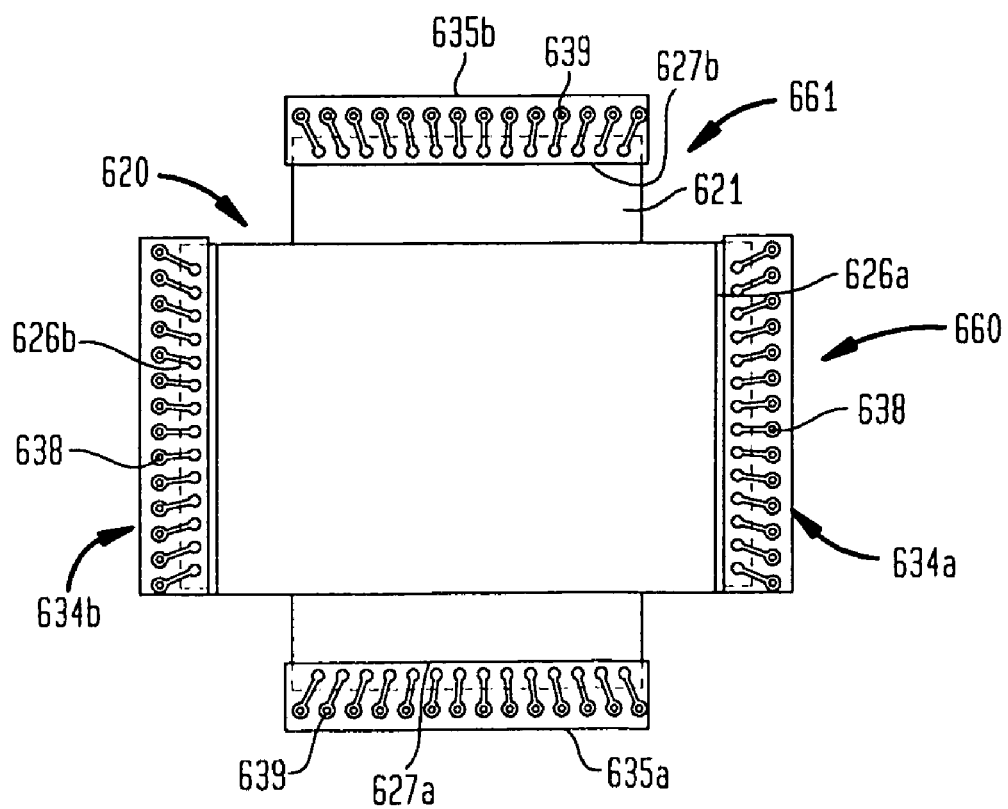
FIG. 16 is a diagrammatic sectional view taken along line 16-16 in FIG. 15.

A module according to a further embodiment of the invention (FIGS. 15 and 16) includes two packages 660 and 661. In this particular module, each package is similar to the packages discussed above with reference to FIGS. 1-6. Thus, package 660 includes a chip 620, generally in the form of an elongated rectangle, and carrier units 634a and 634b overlying edge portions of the front surface 622 of the chip. Here again, the carrier units have rear-facing terminals 638 in the form of posts projecting downwardly past the rear surface 624 of the chip. Carrier unit 634a extends along the shorter edge 626a of the rectangular chip 620, whereas carrier unit 634b extends along the opposite shorter edge 626b. Thus, the carrier units are spaced apart form one another along the long direction of the rectangular chip.

Package 661 is constructed in a similar fashion, with carrier units 635a and 635b extending along shorter edges 627a and 627b of the rectangular chip 621. The carrier units 635a and 635b also have rearwardly-facing terminals in the form of posts 639 projecting from the rearwardly-facing surfaces of the carrier units 635a and 635b. Posts 639, however, are longer than posts 638. Package 661 is disposed over package 660, with the long dimension of chip 621 extending transverse to, and desirably perpendicular to, the long dimension of chip 620. Thus, the shorter edges 627a and 627b of chip 621, and the terminals of carrier units 635a and 635b in package 661 are disposed outside the projected area of package 660. The longer posts 639 in package 661 support the package so that chip 621 extends over chip 620, with the rear face 625 of chip 621 facing toward the front face 622 of chip 620. A unit according to this embodiment of the invention can be fabricated by assembling package 620 to a circuit panel 662, and then assembling package 661 to the same circuit panel.

In other variations, the two packages may be of different configurations. For example, package 661 may be formed with the carrier units overlying the front surface, and with the post-like terminals projecting forwardly as shown in FIG. 11. In another example, the lower chip package 660 may be formed with flat terminals rather than post-like terminals, so as to position this package closer to the circuit panel.

Figure 17:
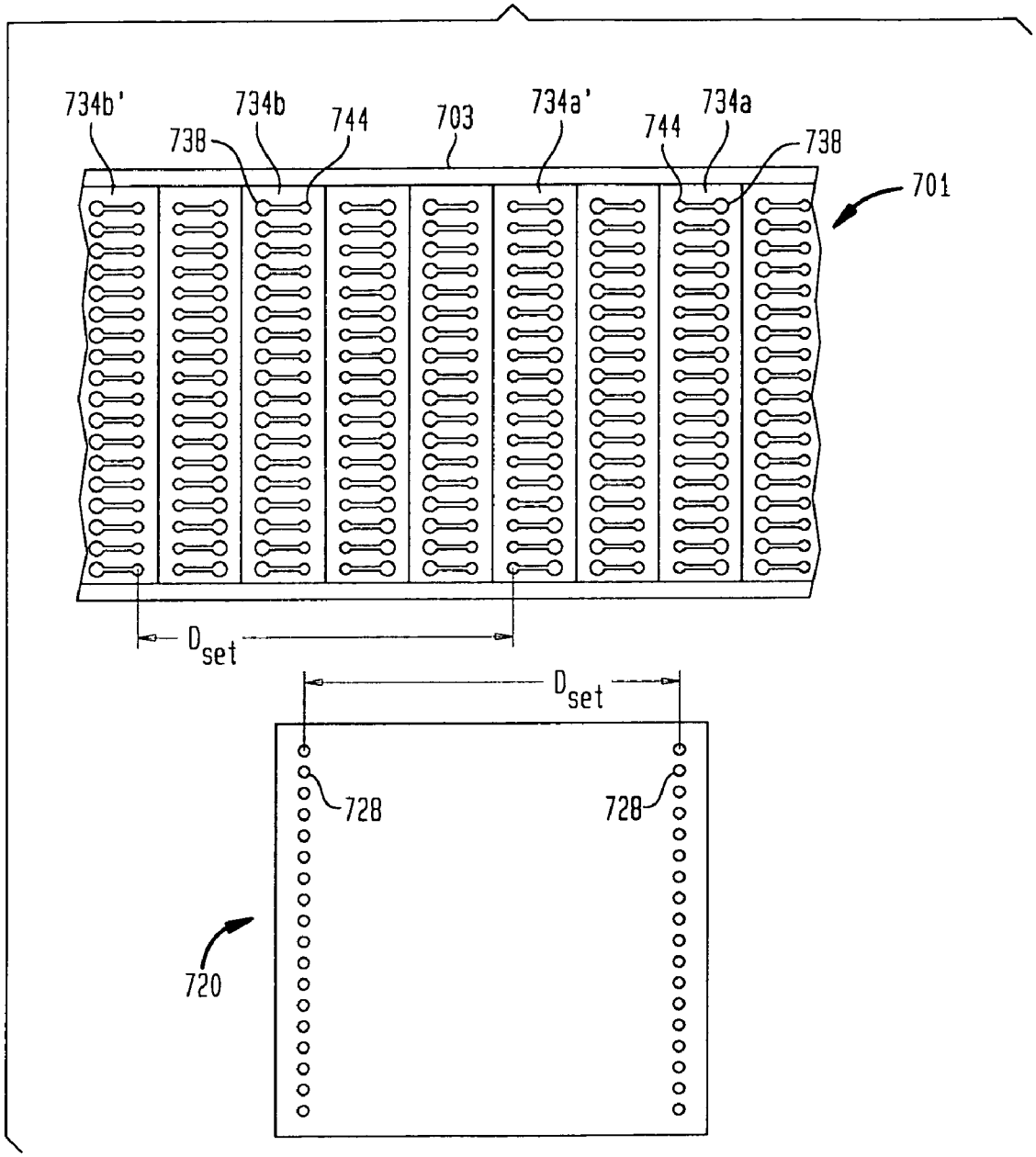
FIG. 17 is a diagrammatic plan view depicting components used in a method according to yet another embodiment of the invention.

In a further variant of the assembly process, a continuous sheet, tape, or other array 701 of carrier units includes first carrier units 734a having one configuration and orientation and also includes second carrier units 734b, which may have the same configuration and orientation, or more typically, a different orientation or configuration. For example, as seen in FIG. 17, each first carrier unit 734a has its terminals 738 disposed to the right of its lead contact ends or bond pads 744; whereas each second carrier unit 734b has the opposite arrangement, with terminals 738 lying to the left of lead contact ends or bond pads 744. The first and second carrier units are interspersed with one another within array 701, and are arranged in sets, each such set including one first carrier unit 734a and one second carrier unit 734b. For example, carrier units 734a and 734b form one such set; unit 734a' and 734b' form another such set. The spacing $D_{SET}$ between the lead contact ends 744 of the first and second carrier units in each set is equal to the distance between rows of contacts 728 in a chip 720, which will be assembled to the carrier units.

The carrier units are releasably held in the array. For example, the carrier units may be formed as portions of a continuous sheet or tape, which is then assembled to a backing element 703, such as a film with a relatively weak adhesive thereon or a fixture having a vacuum device to hold the tape to the fixture. After assembly with the backing element, the individual carrier units are cut apart along the boundaries between them, while remaining in place in the array on the backing element. In an alternate assembly process, such an array can be formed by cutting individual carrier units apart and then assembling to the backing element. The carrier units of one set may be assembled to a chip by aligning the chip with the array so that the contacts 728 on each chip are aligned with the contact ends 744 of the two carrier units constituting the set, and bonding the aligned contact ends and contacts. After bonding, the assembly of the chip and the carrier units of the set is removed from the array, leaving the other carrier units behind. This process is repeated using additional chips and additional sets of carrier units.

Figure 18:
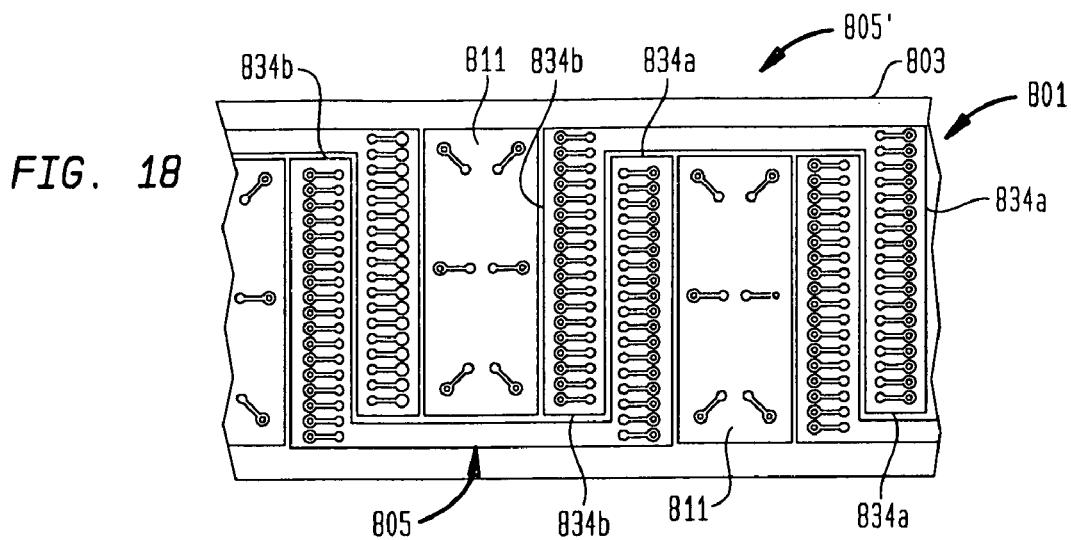
FIG. 18 is a fragmentary, diagrammatic top plan view depicting a portion of a component used in a still further embodiment of the invention.
Figure 19:
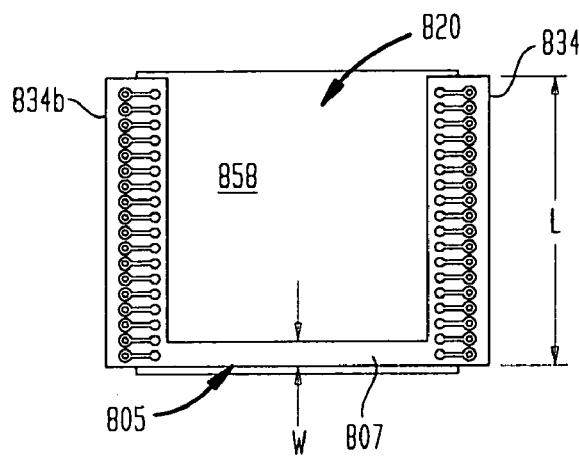
FIG. 19 is a diagrammatic plan view depicting a package made using the component of FIG. 18.

In a further variant (FIGS. 18 and 19), the two chip carriers 834a and 834b used with a single chip 820 are connected to one another by a narrow strip-like connecting element 807 so as to form a composite element 805. As in the embodiments discussed above, the two carrier units 834a and 834b are generally narrow, elongated strip-like elements which extend along opposite edges of chip 820, leaving the major portion 858 of the chip surface uncovered. Strip-like element 807 has a width W desirably less than about one-quarter of the length L of each carrier unit, and desirably even less. Thus, the strip-like unit 807 does not add appreciably to the area occupied by the composite element or to the area of the tape or other sheet required to form the composite element. As shown best in FIG. 18, the various composite elements may be formed as part of a continuous sheet or tape in an array with the carrier units interspersed with one another. Thus, each composite element 805, 805' is generally U-shaped, with the carrier units 834a and 834b forming the vertical legs of the U, and with the strip-like element 807 forming the base of the U. The carrier units 834a and 834b of each composite element 805, 805' project into the opening of the U-shapes formed by other composite elements. The dimensions of the composite element may not allow the composite elements to fully occupy the tape. Stated another way, the shapes may not be such that they can be efficiently "tiled" to occupy all of the space on the tape without leaving gaps. In this case, the unused space may be used to form other structures such as chip carriers 811 for other applications. A similar tiled arrangement may be used with carrier units having other shapes such as a generally H-shaped carrier unit with an elongated strip extending between the longitudinal midpoints of the carrier units. Here again, the cost of the assembly is minimized by minimizing the area of the sheet or tape occupied by the composite elements.

Figure 20:
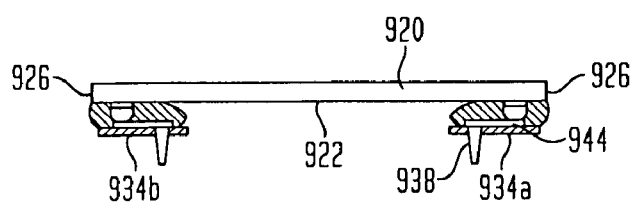
FIG. 20 is a diagrammatic sectional view depicting a package in accordance with yet another embodiment of the invention.
Figure 21:
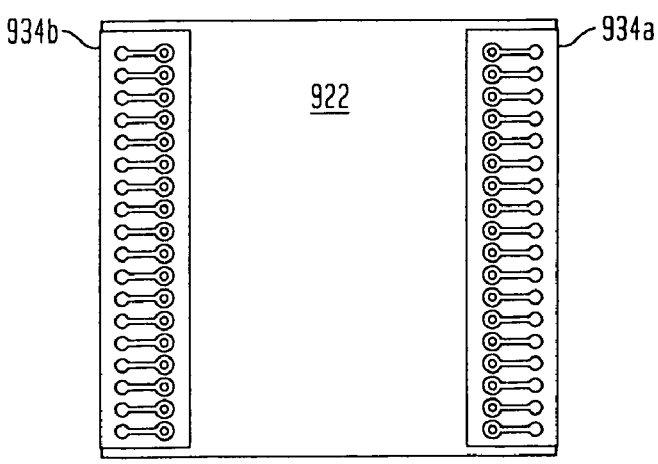
FIG. 21 is a diagrammatic plan view of the package shown in FIG. 20.

In the embodiments discussed above, the carrier units project outwardly beyond the edges of the chip. However, this is not essential. In the embodiment of FIGS. 20 and 21, the carrier units 934*a* and 934*b* are disposed entirely within the boundaries of the chip front surface 922. The terminals 938 are positioned at or inboard of the bond pads or lead contact ends 944. Here again, however, the carrier units are spaced apart from one another and occupy only relatively small edge regions of the chip front surface, adjacent edges 926.

A module according to a further embodiment of the invention (FIG. 22) includes two packaged chips 1060*a* and 1060*b*. Each packaged chip 1060 includes a chip 1020 which has a first edge 1026*a* and a second, opposite edge 1026*b*. Each chip has contacts 1028 exposed at its front surface. In this embodiment, the contacts of each chip are disposed only in an edge region adjacent the first edge 1026*a* of the chip. The regions of the chip front surface 1022 remote from the first edge 1026*a* of the chip are devoid of contacts. For example, the contacts 1028 may be disposed in a single row along edge 1026*a* or in two or more rows adjacent the first edge 1026*a*. Each packaged chip further includes a single carrier unit 1034 overlying the first edge region of the chip. This carrier unit projects laterally outwardly beyond the first edge 1026*a* of the chip and is provided with inwardly-facing terminals 1038 in the form of posts extending rearwardly from the carrier unit and forwardly facing terminals 1048, the terminals being similar to the corresponding features of the embodiment discussed above in connection with FIGS. 1-6. In this embodiment as well, the carrier unit 1034 includes dielectric layer 1036 carrying the terminals 1038, 1048. Here again, the area of the carrier unit, and the area of the dielectric layer 1036 desirably is substantially less than the area of the chip front surface. Preferably, the area of each carrier unit 1034 is about 25% or less of the area of the chip front surface 1022.

Figure 22:
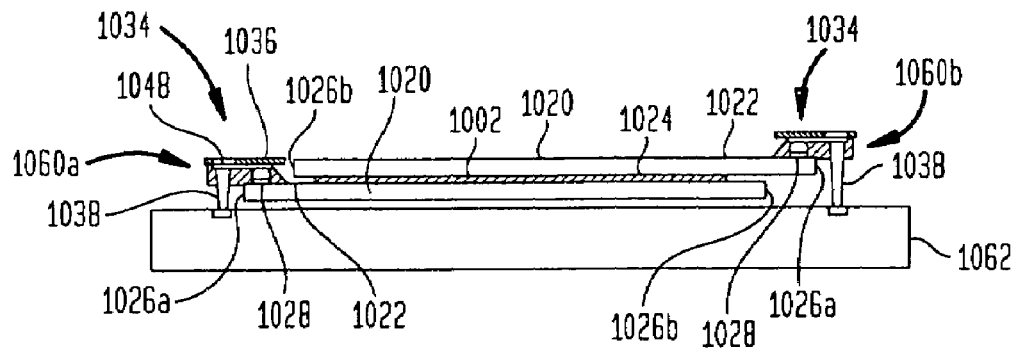
FIG. 22 is a diagrammatic sectional view depicting a module in accordance with a further embodiment of the invention.

In the module of FIG. 22, the packaged chips are stacked in superposed relation with one another. The packaged chips are arranged in opposite orientations, with the first edge 1026*a* and carrier unit 1034 of the lower packaged chip 1060*a* disposed toward the left side of the module as seen in FIG. 22 and with the first edge 1026*a* and carrier unit 1034 of upper packaged chip 1060*b* disposed at the right side of the module as seen in the same drawing. The rear surface 1024 of the chip in the upper packaged chip 1060*b* may be bonded to the front surface 1022 of the chip in the lower packaged chip 1060*a* by an adhesive layer 1002. In this arrangement, the rearward facing terminals 1038 of the packaged chip 1060*b* lie outside of the projected area of the chip and carrier unit in the lower packaged chip 1060*a*. In the particular embodiment shown, the rearward facing terminals 1038 of the upper packaged chip 1060*b* are longer than the corresponding posts or rearward facing terminals 1038 of the lower packaged chip 1060*a*. Thus, terminals 1038 of both packaged chips may be mounted to contact pads on a circuit board 1062.

A module according to a further embodiment of the invention includes four packaged chips 1160*a*, 1160*b*, 1160*c*, and 1160*d*. Each package chip has only a single carrier unit 1134 disposed along a first edge 1126. For example, the chip in the first package chip 1160*a* has a relatively short first edge 1126*a* and a corresponding short, opposite second edge 1126*b* and has longer edges 1126*c* and 1126*d* extending between first and second edges 1126*a* and 1126*b*. This packaged chip has a carrier unit 1134*a* only along edge 1126*a*, to the left in FIG. 23. The other packaged chips are constructed similarly. One pair of packaged chips 1160*a* and 1160*b* is arranged similarly to the two chips of FIG. 22 discussed above. Here again, the two chips of the pair are arranged in opposite orientations, with the carrier unit 1134*b* of the second packaged chip disposed to the right and the carrier unit 1134*a* disposed to the left. The remaining two packaged chips 1160*c* and 1160*d* are disposed in opposite orientations to one another, with their carrier units 1134*c* and 1134*d* disposed along opposite sides of the module. The long edges 1126*c'* and 1126*d'* of packaged chips 1134*d* and 1134*c* extend transversely to the long edges 1126*c* and 1126*d* of packaged chips 1160*a* and 1160*b*. In this arrangement as well, the rearwardly facing terminals 1138 of each packaged chip lie outside of the projected areas of the other packaged chips in the stack.

Figure 23:
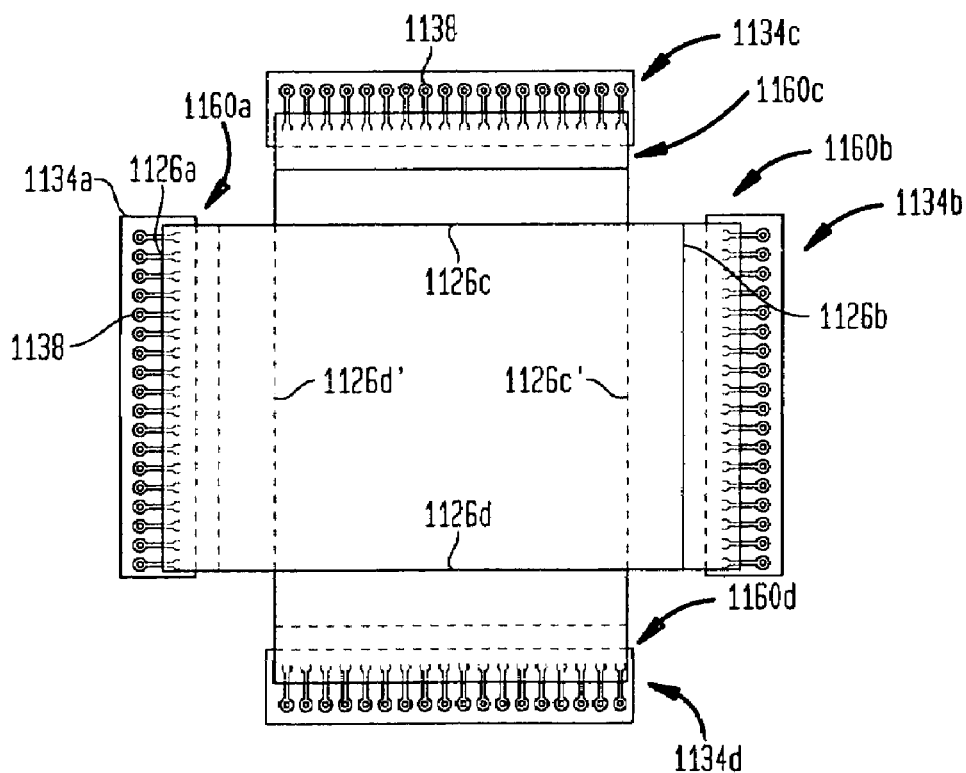
FIG. 23 is a diagrammatic plan view depicting a module in accordance with yet another embodiment of the invention.
Figure 24:
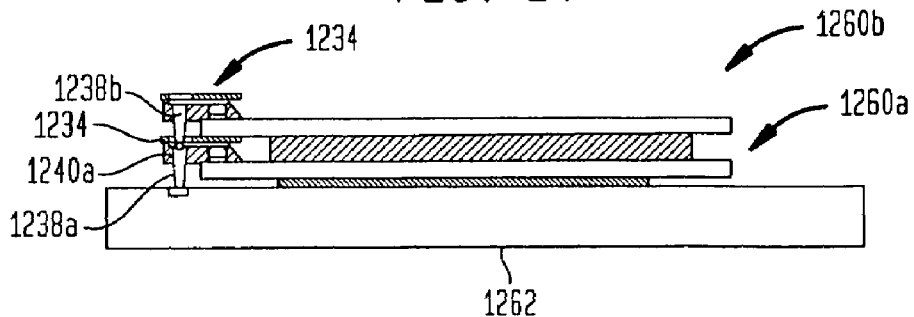
FIG. 24 is diagrammatic sectional view depicting a module in accordance with a still further embodiment of the invention.

A module according to a further embodiment of the invention (FIG. 24) has packaged chips 1260*a*, 1260*b* similar to the packaged chips of FIGS. 22 and 23. Here again, each package chip includes a carrier unit 1234 overlying only one edge region of the chip and projecting laterally outwardly beyond only one edge of the chip. In the module of FIG. 24, however, the packaged chips are superposed on one another in the stack so that the carrier units 1234 and the terminals of the package chips in the stack are aligned with one another. The rearwardly facing terminals 1238*b* of the upper unit 1260*b* are bonded to the forwardly facing terminals 1240*a* of the lower unit 1260*a*. The rearwardly facing terminals 1238*a* of the lower unit are connected to the circuit board 1262.

The embodiments of FIGS. 22-24 have carrier units overlying the front surfaces of the chip. However, carrier units similar to those discussed above in connection with FIGS. 7 and 8, overlying the rear surface of the chip can be employed in arrangements having carrier units along only one edge of the chip.

Figure 25:
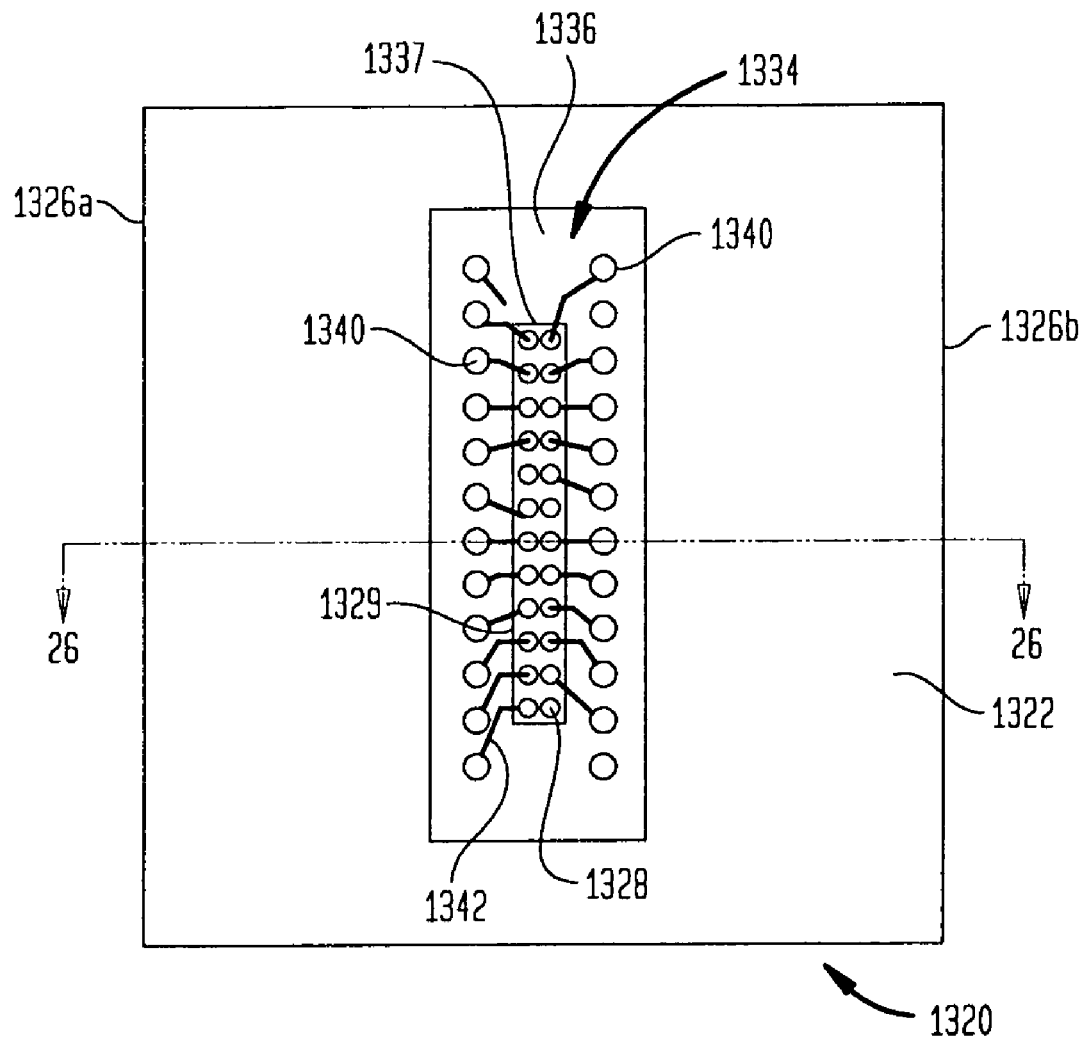
FIG. 25 is a diagrammatic plan view depicting a packaged chip according to yet another embodiment of the invention.

In the embodiments discussed above, the carrier units overlie one or both edge regions of the chip front or rear surface, leaving the central region of such surface uncovered. However, the carrier units may overlie other regions of the chip surface. For example, in the packaged chip of FIGS. 25 and 26, a single carrier unit 1334 incorporating a dielectric layer 1336 and terminals 1340 overlies a central region of the front surface 1322 of chip 1320, remote from edges 1326*a* and 1326*b*. In the particular embodiment depicted, the chip contacts 1328 are disposed in rows within the central region. The chip carrier has traces 1342 connected to the terminals 1340. At least some of the traces are electrically connected to contacts 1328 by wire bonds 1329 or other suitable connections. The dielectric layer 1336 may have a hole 1337 extending through it, and the wire bonds or other connections may extend through the hole.

Figure 26:
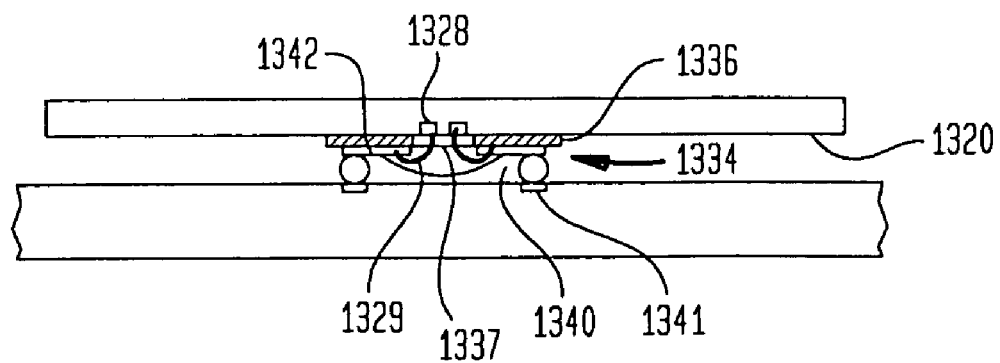
FIG. 26 is a sectional view along line 26-26 in FIG. 25 depicting the packaged chip in conjunction with another component.

In this embodiment as well, the chip carrier 1340 desirably has an area substantially less than the area of chip front surface 1322. For example, the surface area of chip carrier 1340 desirably is less than 50%, and more desirably less than 25%, of the area of the chip surface. In this embodiment as well, the small size of the carrier unit minimizes the cost of the carrier unit. As depicted in FIG. 26, the packaged chip may be mounted to a circuit board 1302 by bonding the terminals 1340 to contact pads 1304 on the circuit board.

Features of the embodiments discussed above can be combined with one another. For example, in a further variant (not shown) two or more separate carrier units are provided on two or more separate regions of the chip surface, but these regions are remote from the edges of the chip. In a further variant, one or more carrier units are provided remote from the edge regions of the chip surface, whereas one or more carrier units overlie the edge regions. Here again, the aggregate surface area of all of the carrier units taken together desirably is substantially less than the area of the chip surface.

Additional features (not shown) can be provided to protect edges and corners of the chip from damage during handling. For example, edges and corners of the chip can be protected by masses of an encapsulant. Such protection can be used, for example, in those embodiments where the carrier unit or carrier units do not overlie all of the edge regions.

In the embodiments described above, the carrier units are used in conjunction with semiconductor chips. However, other microelectronic elements having shape and size similar to semiconductor chips can be packaged in a similar fashion. For example, a dielectric body with passive electrical components thereon, sometimes referred to as an "IPOC" or "integrated passives on chip" can be packaged in the same way.

As these and other variations and combinations of the features discussed above can be utilized without depart from the present invention as defined by the appended claims, the foregoing description of the preferred embodiments should be taken by illustration rather than by limitation of the invention as defined by the claims.

The invention claimed is:

1. A packaged microelectronic element comprising:
   (a) a microelectronic element having front and rear surfaces, edges bounding said surfaces and contacts exposed at said front surface adjacent at least two of said edges;
   (b) a plurality of carrier units, each said carrier unit including a dielectric layer having front and rear surfaces and conductive features including terminals, the dielectric layers of the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts.

2. A packaged microelectronic element as claimed in claim 1 wherein said contacts are disposed in rows adjacent at least two of said edges.

3. A packaged microelectronic element as claimed in claim 1 wherein at least some of said contacts are disposed adjacent first and second opposite edges of said microelectronic element.

4. A packaged microelectronic element as claimed in claim 1 wherein said carrier units project laterally outwardly beyond said microelectronic element, at least some of said terminals being disposed laterally outward of said microelectronic element.

5. A packaged microelectronic element as claimed in claim 1 wherein said edge regions covered by said carrier units have an aggregate area less than 50% of an area of said one of said surfaces.

6. A packaged microelectronic element as claimed in claim 1 wherein said carrier units have an aggregate surface area less than 50% of an area of said one of said surfaces.

7. A packaged microelectronic element as claimed in claim 1 wherein said carrier units are not physically connected to one another except by said microelectronic element.

8. A packaged microelectronic element as claimed in claim 1 wherein said dielectric layers of said carrier units are substantially planar.

9. A packaged microelectronic element as claimed in claim 1 wherein said carrier units overlie edge regions of said front surface.

10. A packaged microelectronic element comprising:
    (a) a microelectronic element having front and rear surfaces, edges bounding said surfaces and contacts exposed at said front surface adjacent at least two of said edges;
    (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;
    wherein said carrier units overlie edge regions of said front surface; and
    wherein said terminals include forward-facing terminals exposed at said front surfaces of said dielectric layers.

11. A packaged microelectronic element comprising:
    (a) a microelectronic element having front and rear surfaces, edges bounding said surfaces and contacts exposed at said front surface adjacent at least two of said edges;
    (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;
    wherein said carrier units overlie edge regions of said front surface; and
    wherein said carrier units project laterally beyond said microelectronic element, said terminals including rear-facing terminals disposed laterally outward of said microelectronic element and exposed at said rear surfaces of said dielectric layers.

12. A packaged microelectronic element as claimed in claim 11 wherein said rear-facing terminals project in a rearward direction from said dielectric layers.

13. A packaged microelectronic element as claimed in claim 12 wherein said rear-facing terminals project beyond said rear surface of said microelectronic element.

14. A packaged microelectronic element comprising:
    (a) a microelectronic element having front and rear surfaces, edges bounding said surfaces and contacts exposed at said front surface adjacent at least two of said edges;
    (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;

wherein said carrier units overlie edge regions of said front surface; and wherein said conductive features include conductors connected to said terminals, said conductors having contact ends remote from said terminals, said contacts of said microelectronic element being connected to said contact ends of said conductors.

15. A packaged microelectronic element as claimed in claim 14 further comprising bumps connecting said contacts with said contact ends of said conductors and an underfill disposed between said dielectric layers and said front surface of said microelectronic element, said underfill surrounding said bumps.

16. A packaged microelectronic element comprising:
   (a) a microelectronic element having front and rear surfaces, edges bounding said surfaces and contacts exposed at said front surface adjacent at least two of said edges;
   (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;
   wherein said carrier units overlie edge regions of said rear surface and project laterally beyond said microelectronic element.

17. A packaged microelectronic element as claimed in claim 16 wherein said conductive features of said carrier units include bond pads electrically connected to at least some of said terminals, wherein said packaged microelectronic element further comprises bond wires connected to said bond pads and to said contacts of said microelectronic element.

18. A packaged microelectronic element as claimed in claim 16 wherein said terminals include forward-facing terminals disposed laterally outward of said microelectronic element and exposed at said front surfaces of said dielectric layers.

19. A packaged microelectronic element as claimed in claim 18 wherein said forward-facing terminals project forwardly from said dielectric layers.

20. A packaged microelectronic element as claimed in claim 19 wherein said forward-facing terminals project beyond said front surface of said microelectronic element.

21. A packaged microelectronic element comprising:
   (a) a microelectronic element having front and rear surfaces, edges bounding said surfaces and contacts exposed at said front surface adjacent at least two of said edges;
   (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;
   wherein said carrier units project laterally outwardly beyond said microelectronic element, and wherein said terminals include rear-facing terminals exposed at the rear surfaces of said dielectric layers and forward-facing terminals exposed at the front surfaces of said dielectric layers, at least some of said terminals being disposed laterally outward of said microelectronic element.

22. A packaged microelectronic element as claimed in claim 21 wherein at least some of said forward-facing terminals are aligned with and electrically connected to at least some of said rear-facing terminals.

23. A module comprising a plurality of packaged microelectronic elements as claimed in claim 22 stacked in superposed relation to one another with the front surface of the microelectronic element in one of said packaged microelectronic elements facing toward the rear surface of the microelectronic element in another one of said packaged microelectronic elements and with the forward-facing and rear-facing terminals of adjacent packaged microelectronic elements in the module connected to one another.

24. A module comprising:
   a plurality of packaged microelectronic elements each comprising:
   (a) a microelectronic element having front and rear surfaces, edges bounding said surfaces and contacts exposed at said front surface adjacent at least two of said edges;
   (b) a plurality of carrier units, each said carrier unit including a dielectric layer having front and rear surfaces and conductive features including terminals, the carrier units overlying edge regions of one of said surfaces of said microelectronic element adjacent at least two of said edges, said carrier units being spaced apart from one another so that a central region of said one of said surfaces between said edge regions is not covered by said carrier units, at least some of the conductive features of said carrier units being electrically connected to at least some of said contacts;
   said plurality of packaged microelectronic elements stacked in superposed relation to one another with the carrier units of one of said packaged microelectronic elements being disposed outside of a projected area defined by the microelectronic element and the carrier units of another one of said packaged microelectronic elements.

25. A module as claimed in claim 24 wherein the microelectronic elements in said packaged microelectronic elements are generally rectangular, each such microelectronic element having long edges and short edges, the carrier units of each said microelectronic element package being disposed adjacent the short edges of the microelectronic element in such package, said packages being stacked so that the long edges of the microelectronic element in one of said packages extend transverse to the long edges of the microelectronic element in another one of said packages.

26. A packaged microelectronic element comprising:
   (a) a microelectronic element having front and rear surfaces, edges bounding said surfaces and contacts exposed at said front surface adjacent a first one of said edges;
   (b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;

wherein said one of said surfaces is the front surface of the microelectronic element and wherein the terminals on the carrier unit include forward-facing terminals exposed at the front surface of the dielectric layer.

27. A packaged microelectronic element as claimed in claim 26 wherein said contacts are disposed in at least one row adjacent said first edge.

28. A packaged microelectronic element as claimed in claim 26 wherein said carrier unit projects laterally outwardly beyond said first edge of said microelectronic element, at least some of said terminals being disposed laterally outward of said microelectronic element.

29. A packaged microelectronic element comprising:
(a) a microelectronic element having front and rear surfaces, edges bounding said surfaces and contacts exposed at said front surface adjacent a first one of said edges;
(b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;
wherein said edge region covered by said carrier unit has an area less than 25% of an area of said one of said surfaces.

30. A packaged microelectronic element as claimed in claim 29 wherein said carrier unit has a surface area less than 25% of an area of said one of said surfaces.

31. A packaged microelectronic element comprising:
(a) a microelectronic element having front and rear surfaces, edges bounding said surfaces and contacts exposed at said front surface adjacent a first one of said edges;
(b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;
wherein said one of said surfaces is the front surface of the microelectronic element, said carrier unit projects laterally beyond said first edge of said microelectronic element, and wherein said terminals include rear-facing terminals disposed laterally outward of said microelectronic element and exposed at said rear surface of said dielectric layer.

32. A packaged microelectronic element comprising:
(a) a microelectronic element having front and rear surfaces, edges bounding said surfaces and contacts exposed at said front surface adjacent a first one of said edges;
(b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;
wherein said one of said surfaces is the rear surface of the microelectronic element, and wherein said carrier unit overlies a first edge region of said rear surface and projects laterally beyond said microelectronic element.

33. A packaged microelectronic element comprising:
(a) a microelectronic element having front and rear surfaces, edges bounding said surfaces and contacts exposed at said front surface adjacent a first one of said edges;
(b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;
wherein said carrier unit projects laterally outwardly beyond said microelectronic element, and wherein said terminals include rear-facing terminals exposed at the rear surface of said dielectric layer and forward-facing terminals exposed at the front surface of said dielectric layer, at least some of said terminals being disposed laterally outward of said microelectronic element.

34. A packaged microelectronic element as claimed in claim 33 wherein at least some of said forward-facing terminals are aligned with and electrically connected to at least some of said rear-facing terminals.

35. A module comprising a plurality of packaged microelectronic elements as claimed in claim 34 stacked in superposed relation to one another with the front surface of the microelectronic element in one of said packaged microelectronic elements facing toward the rear surface of the microelectronic element in another one of said packaged microelectronic elements and with the forward-facing and rear-facing terminals of adjacent packaged microelectronic elements in the module connected to one another.

36. A module comprising:
a plurality of packaged microelectronic elements each comprising:
(a) a microelectronic element having front and rear surfaces, edges bounding said surfaces and contacts exposed at said front surface adjacent a first one of said edges;
(b) a carrier unit including a dielectric layer having front and rear surfaces and conductive features including terminals, the carrier unit overlying an edge region of one of said surfaces of said microelectronic element adjacent said first edge, said carrier unit being configured so that regions of said one of said surfaces remote from said first edge are not covered by said carrier unit, at least some of the conductive features of said carrier unit being electrically connected to at least some of said contacts;
said plurality of packaged microelectronic elements stacked in superposed relation to one another with at least some of the terminals on the carrier unit of one of said packaged microelectronic elements being disposed outside of a projected area defined by the microelectronic element and the carrier unit of another one of said packaged microelectronic elements.

37. A module as claimed in claim 36 wherein the carrier units of two of said packaged microelectronic elements are disposed at opposite sides of the module.

38. A module as claimed in claim 36 including four said packaged microelectronic elements, the carrier units of the four packaged microelectronic elements being disposed at four sides of the module.

39. A packaged microelectronic element comprising:
  (a) a microelectronic element having front and rear surfaces, edges bounding said surfaces and contacts exposed at said front surface adjacent a first one of said edges;
  (b) one or more carrier units including a dielectric layer having front and rear surfaces and conductive features including terminals, the one or more carrier units overlying one or more regions of one of said surfaces of said microelectronic element but not overlying other regions of said one of said surfaces, at least some of the conductive features of said one or more carrier units being electrically connected to at least some of said contacts, said one or more carrier units having a total surface area less than 50% of an area of said one of said surfaces.

40. A packaged microelectronic element as claimed in claim 39 wherein said one or more carrier units have a total surface area less than 25% of an area of said one of said surfaces.

* * * * *